United States Patent
Jeong et al.

(10) Patent No.: US 7,298,654 B2
(45) Date of Patent: Nov. 20, 2007

(54) NON-VOLATILE MEMORY DEVICE AND ASSOCIATED METHOD OF ERASURE

(75) Inventors: Jae-Yong Jeong, Yongin-si (KR); Young-Ho Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 41 days.

(21) Appl. No.: 11/133,234

(22) Filed: May 20, 2005

(65) Prior Publication Data

US 2006/0114725 A1     Jun. 1, 2006

(30) Foreign Application Priority Data

Dec. 1, 2004    (KR) ...................... 10-2004-0099954

(51) Int. Cl.
*G11C 11/34* (2006.01)
(52) U.S. Cl. ........................... 365/185.29; 365/185.28; 365/185.03; 365/185.33
(58) Field of Classification Search ........... 365/185.29, 365/185.3, 185.33, 185.28, 185.03
See application file for complete search history.

(56) References Cited

U.S. PATENT DOCUMENTS

| | | | | |
|---|---|---|---|---|
| 5,636,162 A * | 6/1997 | Coffman et al. | ....... | 365/185.22 |
| 5,745,410 A * | 4/1998 | Yiu et al. | ................ | 365/185.3 |
| 5,841,703 A * | 11/1998 | Wojciechowski | ...... | 365/189.09 |
| 6,172,915 B1 * | 1/2001 | Tang et al. | ............ | 365/185.29 |
| 6,377,488 B1 * | 4/2002 | Kim et al. | ............. | 365/185.22 |
| 2002/0145912 A1 * | 10/2002 | Roohparvar | ........... | 365/185.22 |
| 2003/0072182 A1 * | 4/2003 | Keays | ................... | 365/185.33 |
| 2004/0174747 A1 * | 9/2004 | Tanaka et al. | ......... | 365/185.22 |
| 2005/0002258 A1 * | 1/2005 | Iwase et al. | ................ | 365/222 |

FOREIGN PATENT DOCUMENTS

| KR | 97-29875 | 6/1997 |
|---|---|---|
| KR | 1020010054407 A | 7/2001 |
| KR | 1020020001251 A | 1/2002 |
| KR | 1020020032171 A | 5/2002 |

* cited by examiner

*Primary Examiner*—Ly Duy Pham
(74) *Attorney, Agent, or Firm*—Volentine & Whitt, PLLC

(57) ABSTRACT

Disclosed is a non-volatile memory device and a method of erasing the non-volatile memory device. An erase voltage is simultaneously applied to a plurality of sectors contained in the non-volatile memory device. Then, erase validation is sequentially performed for each of the plurality sectors and results of the erase validation are stored in a plurality of pass information registers. According to the results stored in the pass information registers, sectors which were not successfully erased are simultaneously re-erased and then sequentially re-validated until no such "failed sectors" remain in the non-volatile memory device. Upon eliminating the "failed sectors" from the non-volatile memory device, a post-program operation is sequentially performed on each of the plurality of sectors.

7 Claims, 2 Drawing Sheets

NON-VOLATILE MEMORY DEVICE AND ASSOCIATED METHOD OF ERASURE

BACKGROUND OF THE INVENTION

1. Field of the Invention

The present invention relates generally to a non-volatile memory device. More particularly, the present invention relates to a method of erasing a non-volatile memory device.

A claim of priority is made to Korean Patent Application 2004-99954 filed on Dec. 1, 2004, the disclosure of which is hereby incorporated by reference in its entirety.

2. Description of the Related Art

A non-volatile memory device is a memory device capable of maintaining stored data even when its power supply is interrupted. An example of a non-volatile memory device is flash memory. Flash memory can be broadly classified into two categories according to two distinct memory cell array structures. The two categories of flash memory include NAND flash memory and NOR flash memory.

A NOR flash memory device typically comprises a plurality of flash memory cells used to store data. A flash memory cell generally includes source and drain regions doped with N+ impurities formed on a P-type semiconductor substrate and a channel region interposed between the source and drain regions. In addition, a flash memory cell generally includes a floating gate and a control gate. The floating gate is typically formed on the channel region and a thin insulating layer of 100 Å or less is usually formed between the channel region and the floating gate. The control gate is formed on the floating gate and an insulating layer is formed between the floating gate and the control gate. For programming, erasing, and reading, predetermined bias voltages are applied to the source, drain, gate, and substrate of the flash memory cell.

A flash memory device is typically divided into sectors, wherein each sector comprises a plurality of memory cells. Within each sector, the substrate is electrically connected to all of the plurality of cells so that an erase operation can be performed on the whole sector at once, including all of its memory cells. During the erase operation, a voltage of about −10V is applied to each gate, and a voltage of about 6V is applied to the substrate.

A conventional method for erasing a NOR-type flash memory device comprises a pre-program step, a main erase step, and a post-program step.

The pre-program step involves programming all of the memory cells in a sector using the same bias voltages used in a normal programming operation. The purpose of doing this is so that none of the cells will experience "excessive erasing", i.e., removing too many electrons from the floating gate, in the main erase step. The main erase step is then performed so that all of the flash memory cells in the sector assume a logic state "1". The post-program operation is performed in order to correct the voltage level of memory cells that have been "excessively erased" in the main erase step. The post-program operation is performed in the same manner as the pre-program operation except for the voltage bias conditions.

In the conventional NOR-type flash memory device, the pre-program step, the main erase step, and the post-program step make up fifty percent, thirty percent, and twenty percent of the total erase time, respectively. In other words, the pre-program step and the post-program step make up seventy percent of whole erase time. As a result, the performance of NOR-type flash memory devices could be dramatically improved by reducing the portion of the erase time dedicated to the pre-program step and the post-program step.

SUMMARY OF THE INVENTION

The present invention addresses the need for a time efficient method of erasing memory cells in a non-volatile memory device. According to selected embodiments of the invention, the memory cells are erased by applying an erase voltage to a plurality of sectors within a non-volatile memory device, sequentially performing erase validation on each of the sectors, storing results from the erase validation in pass information registers, and re-erasing and re-validating sectors that were not successfully erased according to the results stored in the pass information registers until no more "failed sectors" remain in the memory device.

According to one embodiment of the invention, a non-volatile memory device comprises a plurality of sectors, a storage device for storing an erase verification result for each of the plurality of sectors, and an erase voltage supplying circuit for selectively supplying an erase voltage to the plurality of sectors according to the erase verification results.

According to another embodiment of the invention, a method of erasing a non-volatile memory device comprises applying an erase voltage to a plurality of sectors in the non-volatile memory device, performing erase verification for each sector in the plurality of sectors, storing an erase verification result in the non-volatile memory device for each sector based on the erase verification, and, simultaneously applying an erase voltage to failed sectors according to the stored erase verification results.

According to still another embodiment of the present invention, a method of erasing a non-volatile memory device comprises resetting pass information registers corresponding to a plurality of sectors in the non-volatile memory device, simultaneously applying an erase voltage to the plurality of sectors, sequentially performing erase verification on each of the plurality of sectors, storing pass/fail information for each of the sectors in the pass information registers based on the erase verification, and simultaneously applying an erase voltage to failed sectors according to the pass/fail information.

According to yet another embodiment of the present invention, a method of erasing a non-volatile memory device comprises resetting pass information registers corresponding to a plurality of sectors in the non-volatile memory device and simultaneously applying an erase voltage to the plurality of sectors. The method further comprises repeating an iterative procedure comprising sequentially performing erase verification on the plurality of sectors, storing pass/fail information for each of sectors in the pass information registers, determining whether any failed sectors remain according to the pass/fail information, and simultaneously applying an erase voltage to failed sectors according to the stored pass/fail information upon determining that at least one failed sector remains in the non-volatile memory device. The iterative procedure terminates when no failed sectors remain in the non-volatile memory device according to the pass/fail information. The method further comprises sequentially performing a post-program operation on the plurality of sectors.

BRIEF DESCRIPTION OF THE DRAWINGS

The invention is described below in relation to several embodiments illustrated in the accompanying drawings.

Throughout the drawings like reference numbers indicate like exemplary elements, components, or steps. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
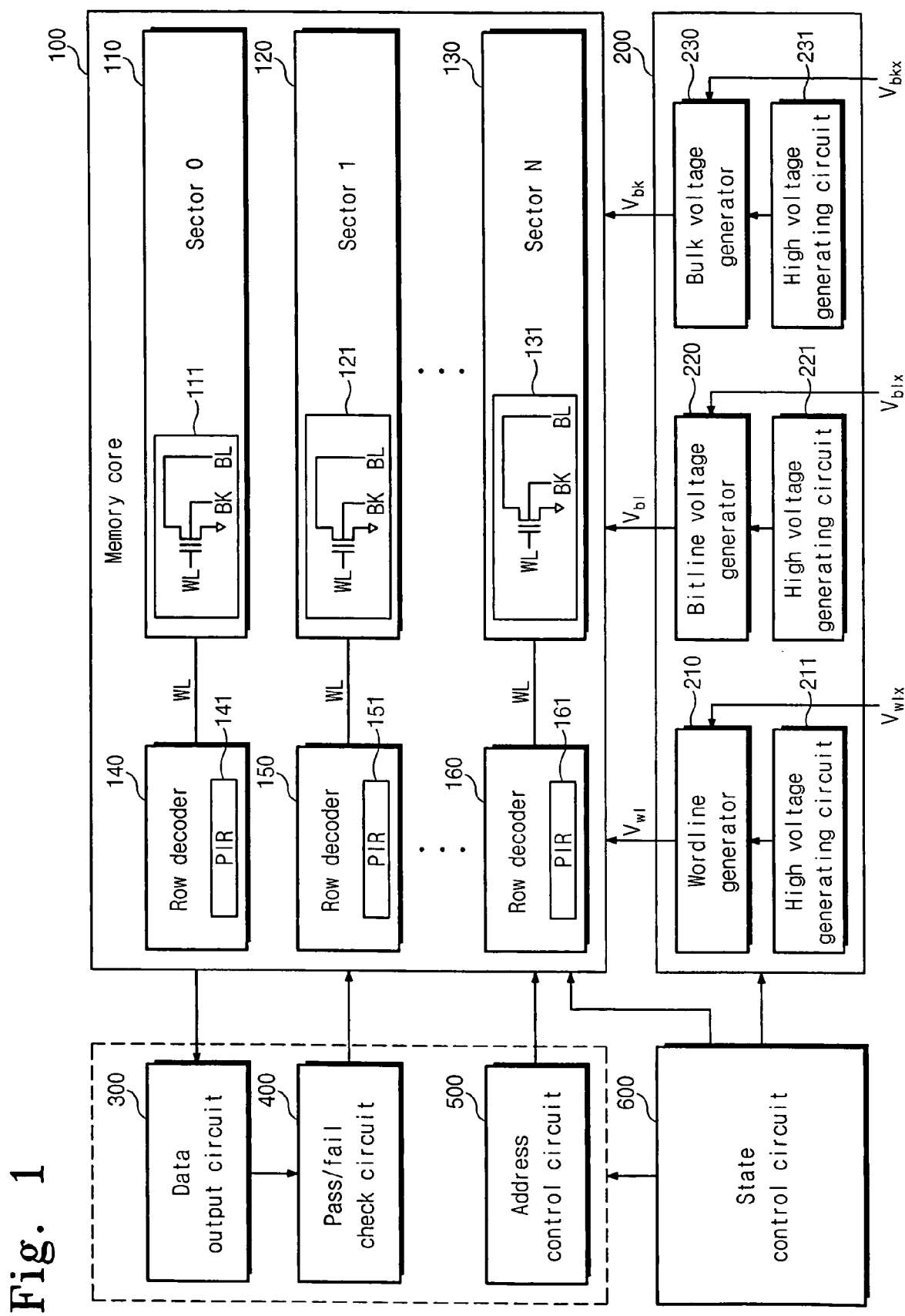
FIG. 1 is a schematic block diagram showing a non-volatile memory device according to one embodiment of the present invention; and, FIG. 2 is a flowchart illustrating an erase method for the non-volatile memory device according to another embodiment of the present invention.

FIG. 1 is a schematic block diagram showing a non-volatile memory device according to one embodiment of the present invention. Although the non-volatile memory device shown in FIG. 1 is a NOR flash memory device, the invention can be embodied by other types of non-volatile memory, such as masked read only memory (MROM), programmable read only memory (PROM), ferroelectric random access memory (FRAM), or NAND flash memory, for example.

Referring to FIG. 1 a non-volatile memory device 1 comprises a memory core 100, an erase voltage supplying circuit 200, a data output circuit 300, a pass/fail check circuit 400, an address control circuit 500, and a state control circuit 600. Memory core 100 includes a plurality of sectors 110, 120, . . . , 130 (Sectors 0-N) and a plurality of row decoders 140, 150, . . . , 160. Each of the plurality of row decoders 140, 150, . . . , 160 is connected to a corresponding sector from the plurality of sectors 110, 120, . . . , 130 by a corresponding word line WL.

Each of the plurality of sectors 110, 120, . . . , 130 is connected to corresponding word and bit lines WL and BL, respectively, and includes a plurality of memory cells arranged in a matrix. A memory cell 111 included in sector 110 receives a word line voltage from its corresponding word line WL, a bit line voltage from its corresponding bit line BL, and a bulk voltage from a bulk terminal BK. During an erase operation of sector 110, all of its memory cells are erased simultaneously.

Each of the plurality of row decoders 140, 150, . . . , 160 includes a corresponding pass information register (PIR) from a plurality of PIRs 141, 151, . . . , 161. Each PIR stores an erase verification result, i.e. an indication of whether or not an erase operation was successful.

Erase voltage supplying circuit 200 supplies erase voltages to word line WL, bit line BL, and bulk terminal BK during the erase operation. For example, erase voltage supplying circuit 200 typically provides a word line voltage $V_{wl}$ of −10V and a bulk voltage $V_{bk}$ of +6V during the erase operation. In addition, erase voltage supplying circuit 200 supplies post-program voltages to word line WL, bit line BL, and bulk terminal BK during a post-program operation. For example, erase voltage supplying circuit 200 typically provides word line voltage $V_{wl}$ of −10V, bulk voltage $V_{bk}$ of +6V, during an erase operation and a bulk voltage of 0V during the post-program operation.

Erase voltage supplying circuit 200 includes a wordline voltage generator 210, a bitline voltage generator 220, and a bulk voltage generator 230.

During the post-program operation, wordline voltage generator 210, bitline voltage generator 220, and bulk voltage generator 230 each receive a high voltage from high voltage generating circuits 211, 221, and 231 included in erase voltage supplying circuit 200. The high voltages received from high voltage generating circuits 211, 221, and 231 are greater than a power supply voltage for non-volatile memory device 1. In some cases the high voltage is supplied by a source outside of non-volatile memory device 1.

According to one embodiment of the present invention, in a case where all of the sectors in a non-volatile memory device are erased at the same time, such as in a fabrication procedure used to produce non-volatile memory device 1, a pre-program step is omitted from the process of erasure. Where the pre-program step is omitted, there is a strong possibility that excessively-erased memory cells will exist. Accordingly, it may be difficult to control a cell current during the post-program operation using only the high voltage generating circuit inside non-volatile memory device 1. For this reason, non-volatile memory device 1 receives additional high voltages $V_{wlx}$, $V_{vlx}$, and $V_{bkx}$ from a source outside of non-volatile memory device 1 and uses the voltages as a program voltage (e.g., bit line voltage) during a program operation.

Data output circuit 300 is a circuit used to output data stored in a memory cell. Data output circuit 300 generally includes a sense amplifier used to sense and output the data. During the erase operation, data stored in the memory cell is sensed and amplified by data output circuit 300.

Pass/fail check circuit 400 receives data output by data output circuit 300 during the erase operation and checks whether the erase operation for each sector was successful or not. Pass/fail check circuit 400 then generates either pass information indicating that the erase operation was successful, or fail information, indicating that the erase operation was unsuccessful.

Address control circuit 500 provides an address ADDR for memory cells within memory core 100. Address ADDR includes a sector address and a cell address. Address control circuit 500 includes an address counter (not shown), which is used to sequentially increase the sector and cell addresses.

State control circuit 600 controls non-volatile memory device 1 during the erase operation. In particular, state control circuit 600 controls operations of memory core 100, erase voltage supplying circuit 200, data output circuit 300, pass/fail check circuit 400, and address control circuit 500. The operation of state control circuit 600 will be more fully described below with reference to FIG. 2.

Figure 2:
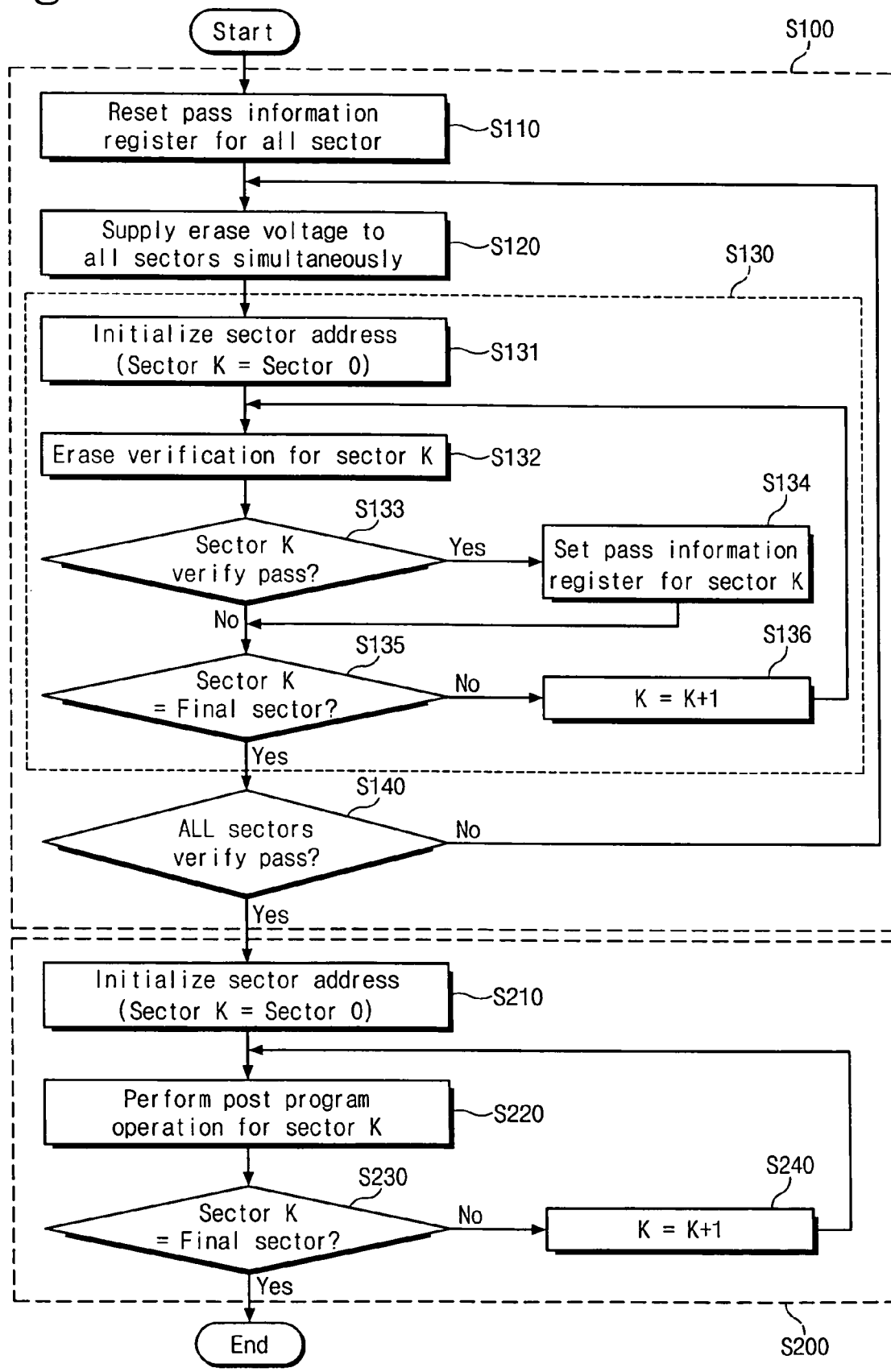

FIG. 2 is a flowchart illustrating a method of erasing a non-volatile memory device according to one embodiment of the present invention. In particular, FIG. 2 illustrates a method for erasing a NOR flash memory device. While most conventional methods of erasing a NOR flash memory device include a pre-program step, a main erase step, and a post-program step, the present invention eliminates the requirement for the pre-program step. In addition, according to the present invention, the sectors of the NOR flash memory device are simultaneously erased during the main erase operation. As a result, erase time is dramatically reduced.

Referring to FIG. 2, the method of erasing a non-volatile memory device comprises a main erase step S100 and a post-program step S200.

Main erase step S100 will be described with reference to FIGS. 1 and 2.

The pass information register PIR corresponding to each sector is reset (S110). This is accomplished by simultaneously providing a register reset signal to each pass information register PIR 141, 151, . . . , 161 in memory core 100 using state control circuit 600. Upon receiving the register reset signal, each pass information register typically stores a value "0".

Once the pass information registers have been reset, an erase voltage is applied to all sectors according to the value stored in each pass information register PIR (S120). Since each pass information register stores the value "0" in operation S120, sectors 110, 120, . . . , 130 are all erased at the same time. State control circuit 600 controls erase voltage supplying circuit 200 to provide an erase voltage to all sectors 110, 120, . . . , 130 in memory core 100.

Next, in an iterative procedure S130, erase verification is performed for each sector in memory core 100. Iterative procedure S130 includes initializing a sector address, verifying whether a sector corresponding to the sector address was successfully erased, setting pass information for the sector, and incrementing the sector address.

The sector address is initialized in an initialization procedure S131. The sector address is initialized by address control circuit 500, which is controlled by state control circuit 600. For purposes of this explanation, it will be assumed that the sector address corresponds to a sector K, which is initially set to sector 0, and that incrementing K is the same as incrementing the sector address.

In an erase verification operation S132, data stored in sector K is read by data output circuit 300 and output to pass/fail check circuit 400 according to control signals provided by state control circuit 600. The erase verification operation is typically performed sequentially for sectors 0 through N.

In an operation S133, pass/fail check circuit 400 determines whether or not sector K was successfully erased. Where sector K has been successfully erased, a pass information register corresponding to sector K is set to store a value "1" (S134). State control circuit 600 controls pass/fail check circuit 400 and then checks whether sector K has been successfully erased or not. Where sector K has been successfully erased, it is considered a "passed sector". Otherwise, it is considered a "failed sector".

An operation S135 determines whether or not sector K is a final sector, i.e., whether iterative procedure S130 has been performed on all sectors in memory core 100. Where sector K is a final sector, iterative procedure S130 is concluded. Otherwise, the sector address is increased (S126) and iterative procedure S130 returns to erase verification operation S132 and operations S132 through S136 are repeated until sector K is a final sector. Where sector K is a final sector, an operation S140 is performed.

Operation S140 determines whether all of sectors 110, 120, . . . , 130 were successfully erased. Where all sectors are "passed sectors", a post-program step is performed. Otherwise, where there is at least one "failed sector", operation S120 and iterative procedure S130 are repeated.

In the case where there is at least one "failed sector", operation S120 applies an erase voltage to sectors whose corresponding pass information registers have a stored value of "0". In other words, the erase voltage is not applied to sectors whose corresponding pass information registers have a stored value of "1". Once the erase voltage has been thus applied, iterative procedure S130 is again performed.

In the case where all sectors are "passed sectors" a post-program operation is performed for all sectors in memory core 100.

Before the post-program operation is initiated, the sector address is initialized by an operation S210. The sector address is initialized by address control circuit 500 in response to state control circuit 600. After the sector address is initialized, the post-program operation is sequentially performed for sectors 0 through N. For purposes of this explanation, it will be assumed that the sector address corresponds to a sector K, where K is a natural number ranging from 0 to N, initially set to 0. Likewise, it will be assumed that incrementing K is the same as incrementing the sector address.

Once the sector address is initialized, the post-program operation is performed (S220). After the post-program operation, an operation S230 is used to determine whether or not sector K is a final sector. Where sector K is determined to be a non-final sector, the sector address is incremented (S240) and post-processing operation S220 and operation S230 are performed repeatedly until sector K is a final sector. Once sector K is a final sector, i.e., the post-program operation has been performed for all sectors in memory core 100, the post-program operation is complete.

In accordance with the method of erasing the non-volatile memory device described above, all sectors are simultaneously erased during a main erase operation. An erase verification operation is performed for each sector in the memory core and a value "1" is stored in pass information registers corresponding to sectors determined to be "passed sectors" by the erase verification operation. Sectors which were determined to be "failed sectors" by the erase verification operation are again simultaneously erased and the erase verification operation is performed on the once again erased "failed sectors". The process of erasing and re-verifying the "failed sectors" is repeated until all sectors in the memory core become "passed sectors". Since all sectors are simultaneously erased during the main erase operation without requiring a pre-program operation, the time needed to erase the non-volatile memory device is dramatically reduced relative to the time required in a case where a conventional method is used. This is particularly beneficial in cases where all sectors need to be erased, such as in a fabricating process.

According to the present invention, the erase time is dramatically reduced by omitting a pre-program operation and by erasing all sectors at the same time during a main erase operation. The present invention is particularly useful in cases where all sectors need to be erased, as in a fabrication step.

The foregoing preferred embodiments are teaching examples. Those of ordinary skill in the art will understand that various changes in form and details may be made to the exemplary embodiments without departing from the scope of the present invention which is defined by the following claims.

What is claimed:

1. A method of erasing a non-volatile memory device, the method comprising:

resetting pass information registers corresponding to a plurality of sectors in the non-volatile memory device;

simultaneously applying an erase voltage to the plurality of sectors;

sequentially performing erase verification on each of the plurality of sectors;

storing pass/fail information for each of the sectors in the pass information registers based on the erase verification;

simultaneously applying an erase voltage to failed sectors according to the pass/fail information; and sequentially performing a post-program operation on the plurality of sectors upon determining that there are no failed sectors according to the pass/fail information;

wherein sequentially performing the post-program operation on the plurality of sectors comprises:

(a) initializing a first sector address;

(b) performing the post-program operation on a sector corresponding to the sector address;

(c) determining whether the sector corresponding to the first sector address is a final sector; and, (d) incrementing the sector address and repeating (b), (c), and (d) upon determining that the sector corresponding to the first sector address is not a final sector.

2. The method of claim 1, further comprising:

repeating the erase verification on each of the plurality of sectors upon determining that there are failed sectors according to the pass/fail information;

storing pass/fail information in the pass information registers for each of sectors according to the erase verification; and, simultaneously applying the erase voltage to the failed sectors according to the pass/fail information.

3. The method of claim 1, wherein sequentially performing erase verification on each of the plurality of sectors comprises:

(a) initializing a second sector address;

(b) performing erase verification on a sector corresponding to the second sector address;

(c) determining whether the sector corresponding to the second sector address is a final sector; and, (d) incrementing the second sector address and repeating (b), (c), and (d) upon determining that the sector corresponding to the second sector address is not a final sector.

4. A method of erasing a non-volatile memory device, the method comprising:

resetting pass information registers corresponding to a plurality of sectors in the non-volatile memory device;

simultaneously applying an erase voltage to the plurality of sectors;

repeating an iterative procedure comprising:

sequentially performing erase verification on the plurality of sectors;

storing pass/fail information for each of sectors in the pass information registers;

determining whether any failed sectors remain according to the pass/fail information; and, simultaneously applying an erase voltage to failed sectors according to the stored pass/fail information upon determining that at least one failed sector remains in the non-volatile memory device;

until no failed sectors remain in the non-volatile memory device according to the pass/fail information; and, sequentially performing a post-program operation on the plurality of sectors;

wherein sequentially performing the post-program operation on the plurality of sectors comprises:

(a) initializing a first sector address;

(b) performing the post-program operation on a sector corresponding to the first sector address;

(c) determining whether the sector corresponding to the first sector address is a final sector; and, (d) incrementing the sector address and repeating (b), (c), and (d) upon determining that the sector corresponding to the first sector address is not a final sector.

5. The method of claim 4, wherein sequentially performing erase verification on each of the plurality of sectors comprises:

(a) initializing a second sector address;

(b) performing erase verification on a sector corresponding to the second sector address;

(c) determining whether the sector corresponding to the second sector address is a final sector; and, (d) incrementing the sector address and repeating (b), (c), and (d) upon determining that the sector corresponding to the second sector address is not a final sector.

6. The method of claim 4, further comprising:

supplying a program voltage to a high voltage generating circuit inside of the non-volatile memory device during the post-program operation;

wherein the program voltage is higher than a power supply voltage for the non-volatile memory device.

7. The method of claim 4, wherein a program voltage is supplied to the non-volatile memory device; and, wherein the program voltage is higher than a power supply voltage for the non-volatile memory device.

* * * * *